(12) United States Patent
Ausserlechner

(10) Patent No.: US 7,928,743 B2
(45) Date of Patent: Apr. 19, 2011

(54) MEASURING BRIDGE ARRANGEMENT, METHOD OF TESTING A MEASURING BRIDGE, TEST ARRANGEMENT FOR TESTING A MEASURING BRIDGE, METHOD OF PRODUCING A TESTED MEASURING BRIDGE ARRANGEMENT, AND COMPUTER PROGRAM

(75) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 397 days.

(21) Appl. No.: 12/130,723

(22) Filed: May 30, 2008

(65) Prior Publication Data
US 2008/0297181 A1    Dec. 4, 2008

(30) Foreign Application Priority Data
May 30, 2007  (DE) .......................... 10 2007 025 001

(51) Int. Cl.
  *G01R 17/10*  (2006.01)
  *G01R 27/08*  (2006.01)
  *G01R 33/12*  (2006.01)
(52) U.S. Cl. ......... 324/725; 324/706; 324/610; 324/210
(58) Field of Classification Search .......... 324/210–212, 324/610, 706, 725; 327/588
See application file for complete search history.

(56) References Cited

U.S. PATENT DOCUMENTS

| 3,933,149 | A  | * | 1/1976  | Salera et al. .............. 600/549 |
| 5,121,064 | A  | * | 6/1992  | Eller ......................... 324/706 |
| 5,485,100 | A  | * | 1/1996  | Kogut ......................... 324/610 |
| 5,631,602 | A  | * | 5/1997  | Kearney et al. .............. 73/1.38 |
| 6,118,278 | A  | * | 9/2000  | Rother ......................... 324/706 |
| 6,646,446 | B2 | * | 11/2003 | Maher et al. .................. 324/610 |
| 7,058,532 | B1 | * | 6/2006  | Yamagishi et al. ........... 702/100 |
| 7,088,108 | B2 | * | 8/2006  | Konig et al. .................. 324/610 |
| 7,323,870 | B2 | * | 1/2008  | Tatschl et al. ................ 324/252 |
| 2005/0194980 | A1 | * | 9/2005 | Konig et al. .................. 324/610 |
| 2006/0202692 | A1 | * | 9/2006 | Tatschl et al. ................ 324/252 |

FOREIGN PATENT DOCUMENTS
DE    43 23 380 A1    1/1995
DE    101 33 525 A1   1/2003

* cited by examiner

*Primary Examiner* — Timothy J Dole
(74) *Attorney, Agent, or Firm* — Slater & Matsil, L.L.P.

(57) ABSTRACT

A measuring bridge arrangement has a measuring bridge with a first supply terminal and first and second measuring signal terminals. The measuring bridge arrangement has a working point adjustment circuit formed to feed the measuring bridge via at least the first supply terminal in a measuring state of operation, and to apply a signal to one of the measuring signal terminals in the test state of operation in order to bring the measuring bridge to a test working point different from a measuring working point in the measuring state of operation. The measuring bridge has a test tap, wherein a test signal dependent on resistive properties of at least one element of the measuring bridge can be tapped at the test tap of the measuring bridge.

39 Claims, 10 Drawing Sheets

MEASURING BRIDGE ARRANGEMENT, METHOD OF TESTING A MEASURING BRIDGE, TEST ARRANGEMENT FOR TESTING A MEASURING BRIDGE, METHOD OF PRODUCING A TESTED MEASURING BRIDGE ARRANGEMENT, AND COMPUTER PROGRAM

This application claims priority from German Patent Application No. 10 2007 025 001.2, which was filed on May 30, 2007, and is incorporated herein in its entirety by reference.

TECHNICAL FIELD

Embodiments of the invention relate to a measuring bridge arrangement, to a method of testing a measuring bridge, to a test arrangement for testing a measuring bridge, to a method of producing a tested measuring bridge arrangement, and to a computer program.

SUMMARY OF THE INVENTION

Some embodiments of the invention concern a measuring bridge arrangement with a measuring bridge. The measuring bridge includes a first supply terminal, a first measuring signal terminal and a second measuring signal terminal, in some embodiments. The measuring bridge arrangement includes a working point adjustment circuit formed to feed the measuring bridge via at least the first supply terminal in a measuring state of operation, and to apply a signal to one of the measuring signal terminals in a test state of operation, so as to bring the measuring bridge to a test working point different from a measuring working point in the measuring state of operation. The measuring bridge includes a test tap, wherein a test signal dependent on resistive properties of at least one element of the measuring bridge can be tapped at the test tap of the measuring bridge.

Further embodiments of the invention concern a method of testing a measuring bridge.

Again further embodiments of the invention concern a corresponding computer program.

Again further embodiments of the invention concern a test arrangement for testing a measuring bridge.

Again further embodiments of the invention concern a method of producing a tested measuring bridge arrangement.

BRIEF DESCRIPTION OF THE DRAWINGS

Embodiments of the present invention will be detailed subsequently referring to the appended drawings, in which.

DETAILED DESCRIPTION OF ILLUSTRATIVE EMBODIMENTS

Figure 1:
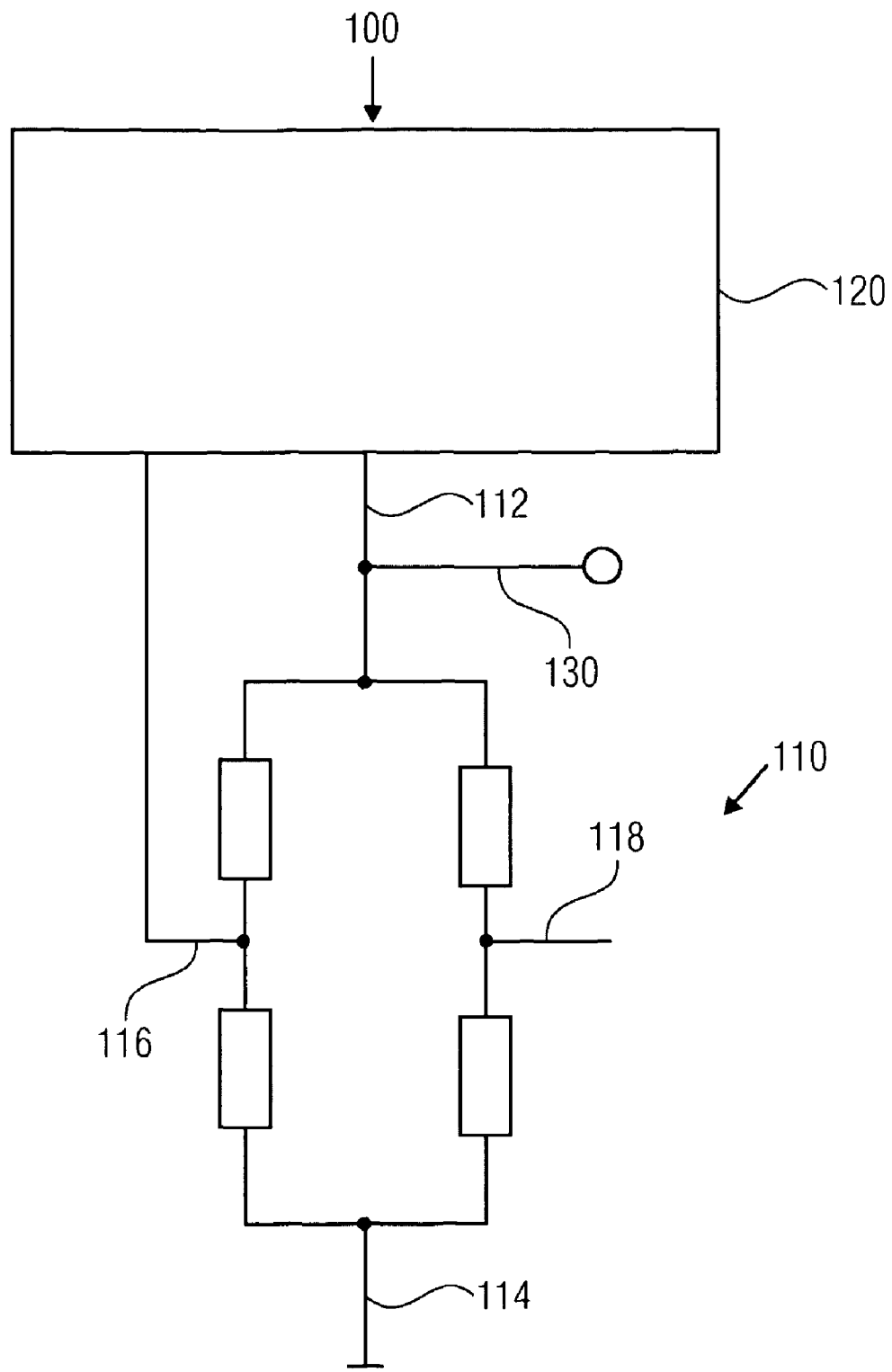
FIG. 1 shows a block circuit diagram of a measuring bridge arrangement according to the embodiment of the invention.

FIG. 1 shows a block circuit diagram of a measuring bridge arrangement according to an embodiment of the invention. The measuring bridge arrangement according to FIG. 1 is designated with 100 in its entirety.

The measuring bridge arrangement 100 includes a measuring bridge 110 with a first supply terminal 112, a second supply terminal 114, a first measuring signal terminal 116 and a second measuring signal terminal 118. The measuring bridge arrangement 100 further includes a working point adjustment circuit 120, which is coupled to the first supply terminal 112 and the first measuring signal terminal 116, for example.

The working point adjustment circuit 120, for example, is formed to feed the measuring bridge 110 via at least the first supply terminal 112 in a measuring state of operation, and to apply a signal to one of the measuring signal terminals, for example, to the first measuring signal terminal 116, in a test state of operation, so as to bring the measuring bridge 110 to a test working point different from a measuring working point in the measuring state of operation.

Besides, the measuring bridge 110 includes a test tap 130, wherein a test signal dependent on resistive properties of at least one element of the measuring bridge may be tapped at the test tap of the measuring bridge.

The measuring bridge arrangement 100 offers extended diagnosis possibilities. By the working point adjustment circuit 120 enabling the measuring bridge to be fed both at the first supply terminal (or via the first supply terminal) and at one of the measuring signal terminals, the measuring bridge may be operated at two different working points. In some embodiments, this allows for performing an extended diagnosis. For example, if two resistive elements of the measuring bridge 110 are known, the remaining two resistive elements may, for example, be determined computationally on the basis of two measurement values for a signal at the tap 130. On the other hand, if less than two of the resistive elements are known, statements on a ratio between element values can still be made.

Furthermore, the measuring bridge arrangement 100 allows for extension of the diagnosis possibilities without problems. For example, the measuring bridge 110 may be brought to more than two different working points, whereby the individual resistances can be determined even more accurately (for example, in absolute values and not only as ratio values).

By the described diagnosis capability, namely, for example, by the possibility to computationally determine element values of individual resistive elements of the measuring bridge 110 based on measurements of a signal at the tap, a test of a measuring bridge may besides be simplified substantially. By the fact that individual element values can be determined separately in some embodiments of the invention, it is not necessary in some embodiments for testing the measuring bridge to impart the measuring bridge with a measurement quantity, as it occurs in an actual application (e.g., in a strongly inhomogeneous magnetic field). Rather, in some embodiments, it may be sufficient to impart the individual resistive elements of the measuring bridge with certain configurations of the measurement quantity that are easy to produce (e.g., with a homogeneous magnetic field), but with a reliable test of the measuring bridge or the resistive element belonging to the measuring bridge being possible.

Thus, it is to be stated that a test of the measuring bridge may be simplified substantially in some embodiments of the invention by separately determining element values of individual resistive elements of the measuring bridge. This separate determination is made possible by bringing the measuring bridge to different working points from the outside, i.e., for example, by feeding at a first supply terminal and, as an alternative thereto, at the first measuring signal terminal.

Besides, in some embodiments, it is possible to determine element values of individual resistive elements of the measuring bridge 110 without undoing the measuring bridge. In other words, in some embodiments, the measuring bridge itself does not contain any switches that could lead to corruption of a measurement result in the measuring state of operation through their parasitic resistances. In other words, the connection of the measuring bridge may remain unchanged in the determination of the element values (e.g., the resistance values) of individual resistive elements, if the determination of the element values of the individual resistive elements is substantially enabled by the adjustment of different working points. Thus, in some embodiments, there is the possibility of testing the measuring bridge 110 or determining element values of individual resistive elements of the measuring bridge, without reducing an accuracy of the measuring bridge (for example, by additional switches).

Figure 2A:
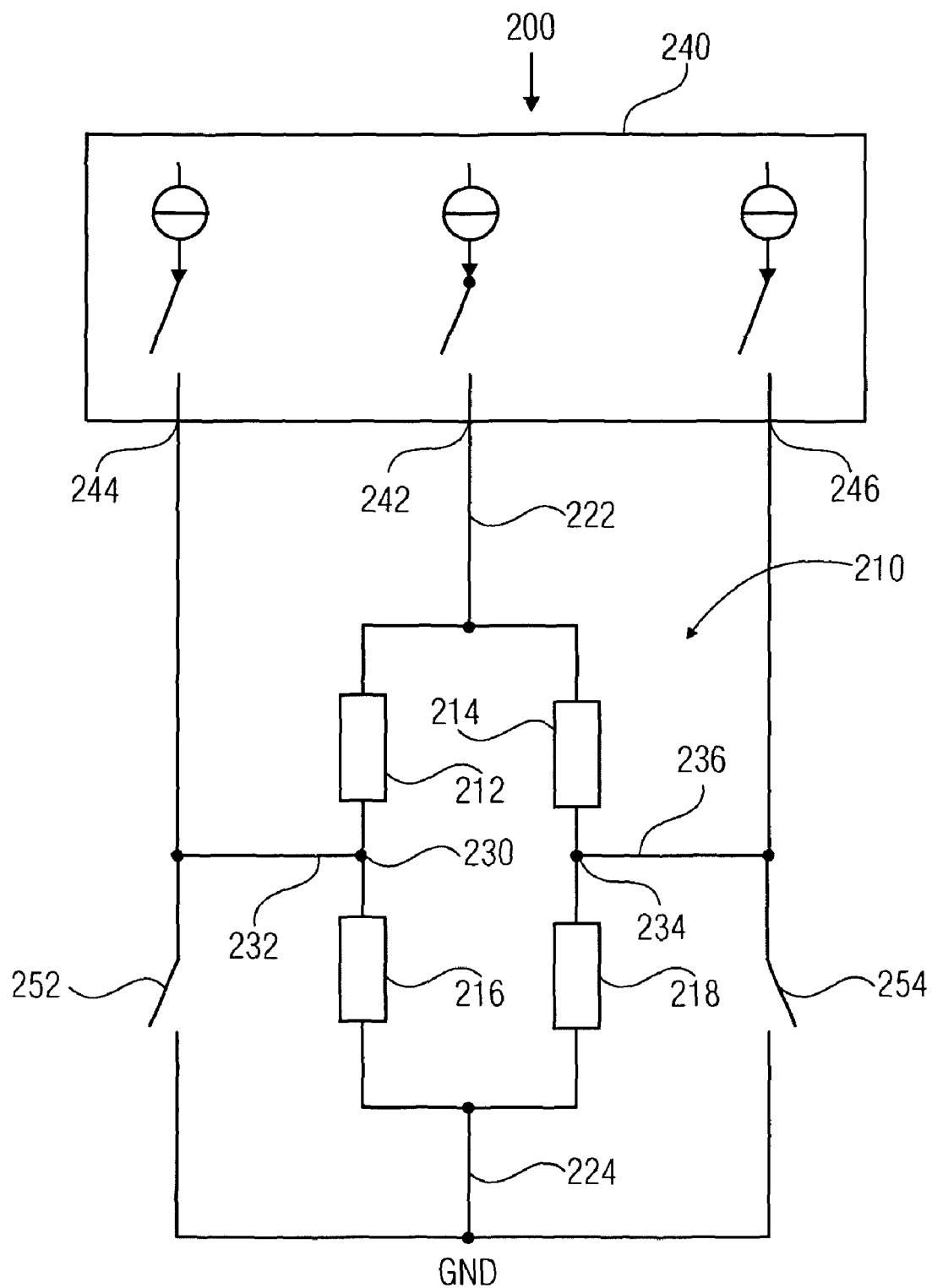
FIG. 2*a* shows a block circuit diagram of a measuring bridge arrangement according to a further embodiment of the invention.

FIG. 2a shows a block circuit diagram of a measuring bridge arrangement according to another embodiment of the invention. The measuring bridge arrangement according to FIG. 2 is designated with 200 in its entirety. The measuring bridge arrangement 200 includes a measuring bridge 210. The measuring bridge 210 includes a first resistive element 212, a second resistive element 214, a third resistive element 216 and a fourth resistive element 218. The resistive elements 212 to 218 are connected into a bridge circuit. For example, the first resistive element 212 and the third resistive element 216 thus are connected in series between a first supply terminal 222 and a second supply terminal 224. Furthermore, the second resistive element 212 and the fourth resistive element 218 are also connected in series between the first supply terminal 222 and the second supply terminal 224. Thus, there are two parallel branches bridge branches, namely a first branch including the first resistive element 212 and the third resistive element 216, and a second branch including the second resistive element 214 and the fourth resistive element 218. A node 230 electrically located between the first resistive element 212 and the third resistive element 216 (at which the first resistive element 212 and the third resistive element 216 are connected, for example) is connected to a first measuring signal terminal in electrically effective manner. In other words, the measuring signal terminal 232 may be regarded as a tap between the first resistive element 212 and the third resistive element 216. Furthermore, a node 234 electrically located between the second resistive element 214 and the fourth resistive element 218 is coupled to the second measuring signal terminal 236. In other words, a tap between the second resistive element 214 and the fourth resistive element 218 may be regarded as the second measuring signal terminal 236.

The measuring bridge arrangement 200 further includes a switchable current source 240. The switchable current source 240 includes a first output 242 for a first current signal, a second output 244 for a second current signal, and a third output 246 for a third current signal. The first output 242 of the switchable current source 240 here is coupled to the supply terminal 222 of the measuring bridge 210. The second output 244 of the switchable current source 240 further is coupled to the first measuring signal terminal 232. Furthermore, the third terminal 246 of the switchable current source 240 is coupled to the second measuring signal terminal 236.

The measuring bridge arrangement 200 further includes a first short-circuit switch 252 connected in parallel to the second resistive element 216 (but may alternatively also be connected in parallel to the first resistive element 212), so as to be able to selectively (for example, depending on a control signal, that is) bridge or short-circuit the second resistive element. The measuring bridge arrangement 200 further includes a second short-circuit switch 254 connected in parallel to the fourth resistive element 218, so as to be able to selectively (for example, depending on a control signal, that is) short-circuit the fourth resistive element 218 (wherein the second short-circuit switch may also alternatively be connected in parallel to the third resistive element 214, so as to be able to short-circuit the third resistive element 214).

Based on the above structural description, the functioning of the circuitry 200 will be explained briefly in the following. The switchable current source 240 is configured to selectively provide a current at the first terminal 242 and/or at the second terminal 244 and/or at the third terminal 246 (for example, controlled by one or more control signals). In other words, it may be assumed that, in an embodiment, a substantially predetermined current may be impressed on a current source circuit at the first terminal 242 (wherein the internal resistance of the current source circuit is, for example, at least twice as high, but better than ten times as high than resistance values of the resistive element 212 to 218). The current supplied to the first terminal 242 from the switchable current source 240 may be switched on and off, in one embodiment. If a current is provided at the first terminal 242 (i.e., the first output 242 is switched on), the measuring bridge 210 is supplied by this current via the first supply terminal 222. In this case, for example, a measuring state of operation is present, and a bridge output voltage may for example be determined as a differential voltage between the first measuring signal terminal 232 and the second measuring signal terminal 236.

Furthermore, at the second terminal 244 of the switchable current source 240, current may be made available also by a current source arrangement (for example, with high internal resistance). The current provided at the second terminal 244 may be switched on and off depending on one or more control signals. Thus, the bridge circuit 210 may also be supplied via the first measuring signal terminal 232 if the current flow to the second terminal 244 of the switchable current source 240 is switched on.

Furthermore, the switchable current source 240 is formed to provide a switchable current at the third terminal 246, in one embodiment. The provision of the current at the third terminal 246 here again takes place via a current source circuit (for example, with high internal resistance). Thus, the measuring bridge 210 may also be supplied via the second measuring signal terminal 236 if the switchable current source 240 supplies current at the third terminal 246.

In some embodiments, it is thus enabled, by the switchable current source 240, to operate the measuring bridge 210 at different working points, i.e., with different feeding. Thus, the switchable current source 240 may, for example, be configured (or be controlled) so as to feed the bridge circuit 210 via the first supply terminal 222 in a first state (wherein, for example, no current or only a negligibly low current is provided via the second terminal 244 and the third terminal 246 of the switchable current source 240), so as to feed the measuring bridge 210 via the first measuring signal terminal 232 in a second state (wherein a current is provided via the second terminal 244 of the switchable current source 240, for example, and wherein no current or only a negligibly low current is provided via the first terminal 242 and the third terminal 246 of the switchable current source 240, for example), and so as to feed the bridge circuit 210 via the second measuring signal terminal 236 in a third state (wherein the switchable current source 240 provides current via the third terminal 246, and wherein no current is provided to the switchable current source via the first terminal 242 and the second terminal 244). Thus, the measuring bridge 210 may be operated at three different working points, and respective signals may be measured for the three states mentioned. For example, in the three different states mentioned, a voltage level present at the first supply terminal 222 of the measuring bridge 210 may be measured. The measurement may here, for example, be done with respect to a reference potential GND, which, for example, is present at the second supply terminal 224 of the measuring bridge 210.

In the three states mentioned, however, also other signals may be measured, for example, a voltage at the first measuring signal terminal 232 (for example, with respect to the reference potential GND), a voltage at the second measuring signal terminal 236 (for example, with respect to the reference potential GND) or also, alternatively or additionally, a voltage difference between the first measuring signal terminal 232 and the second measuring signal terminal 236. Furthermore, it is to be pointed out that also voltages at various nodes of the measuring bridge 210 may be measured in the various states.

Furthermore, the measuring bridge 210 may be set to a fourth working point by closing one or both of the short-circuit switches 252, 254. For example, in a fourth state, the measuring bridge 210 may be fed via the first supply terminal 222 (wherein the switchable current source 240 provides current at the first terminal 242, for example, and wherein the switchable current source provides no current via the second terminal 244 and the third terminal 246, for example). Furthermore, in the fourth state, for example, both the first short-circuit switch 252 and the second short-circuit switch 254 may be closed, so that the third resistive element 216 and the fourth resistive element 218, for example, are bridged in low-ohmic manner (wherein a resistance of the short-circuit switch 252, 254 in one embodiment is smaller than a resistance of the resistive elements 216, 218). In the fourth state, for example, a voltage at the first supply terminal 222 may be determined.

From the voltages measured in the various above-mentioned states (e.g., in the first state, the second state, the third state and the fourth state), at a node of the bridge circuit 210 (or alternatively at various nodes of the bridge circuit 210), then, for example, element values of the resistive elements 212, 214, 216, 218 (or only one or some of the resistive elements mentioned) may be calculated.

With respect to the realization of the switchable current source 240, it is to be pointed out that for example each of the terminals 242, 244, 246 of the switchable current source 240 may be coupled to a switchable current source of its own. Thus, for example, different currents may be provided at the various terminals 242, 244, 246 of the switchable current source 240. The switchable current source shown in FIG. 2a, for example, also is suited for providing respective currents simultaneously at several ones of the outputs 242, 244, 246, if this is desired for adjusting a working point of the bridge circuit 210. Voltages measured when feeding the bridge via several terminals may also be used for determining the element values.

Figure 2B:
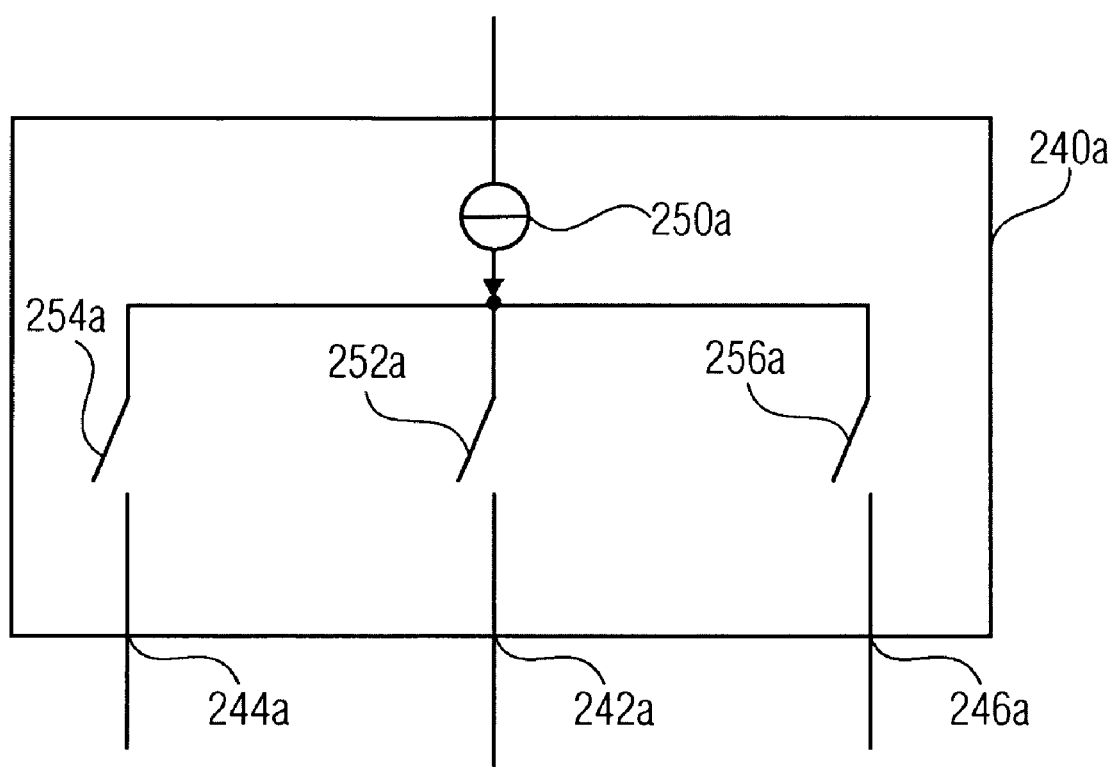
FIG. 2*b* shows a block circuit diagram of a current source circuit that may be employed as an alternative to the current source circuit shown on the basis of FIG. 2*a*.

FIG. 2b shows a block circuit diagram of an alternative circuitry for realization of the switchable current source 240. The switchable current source of FIG. 2b is designated with 240a in its entirety and may, for example, take the place of the switchable current source 240 according to FIG. 2a. As can be seen from FIG. 2b, the switchable current source 240a, for example, includes a single current source 250a the total current of which may be conducted via three switches 252, 254a, 256a to the corresponding outputs 242a, 244a, 246a. In other words, in the current source circuit according to FIG. 2b, the total current present at the outputs 242a, 244a, 246a altogether, is predetermined. The current source arrangement 240a thus, for example, is suited for alternative supply of the measuring bridge 210 either via the first supply terminal 222 or via the first measuring signal terminal 232 or via the second measuring signal terminal 236.

Figure 3:
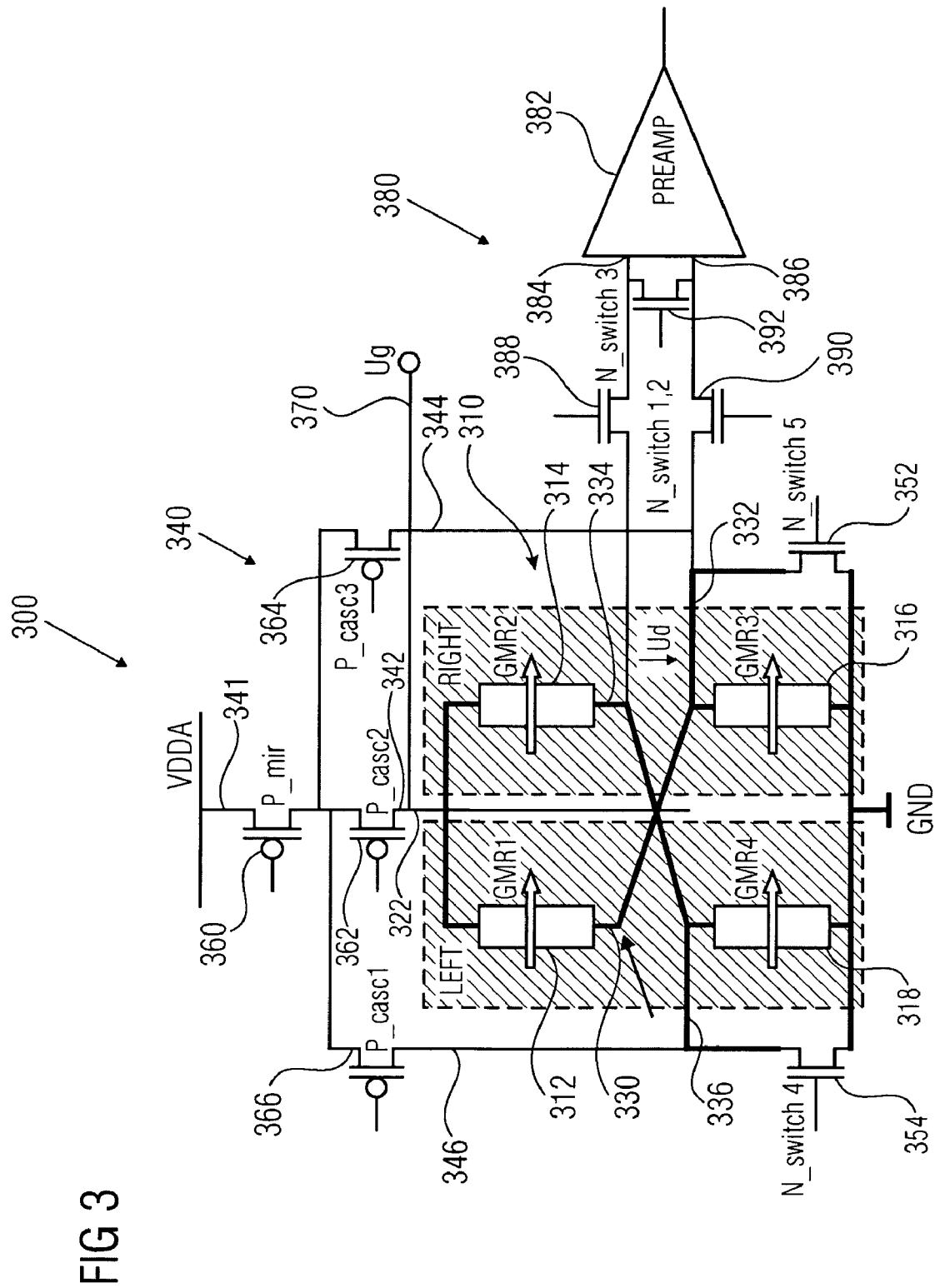
FIG. 3 shows a circuit diagram of a measuring bridge arrangement according to a further embodiment of the invention.

FIG. 3 shows a circuit diagram of a measuring bridge arrangement according to an embodiment of the invention. The measuring bridge arrangement according to FIG. 3 is designated with 300 in its entirety. The measuring bridge arrangement includes a measuring bridge 310. The measuring bridge 310 includes a first GMR resistor 312, a second GMR resistor 314, a third GMR resistor 316 and a fourth GMR resistor 318. The measuring bridge 310 further includes a first supply terminal 322 as well as a first measuring signal terminal 332 and a second measuring signal terminal 336. The first GMR resistor 312 and the third GMR resistor 316 are connected in series between the first supply terminal 322 and a reference potential GND. Besides, a node 330 between the first GMR resistor 312 and the third GMR resistor 316 is connected to the first measuring signal terminal 332. The second GMR resistor 314 and the fourth GMR resistor 318 are connected in series between the supply potential 322 and the reference potential GND. A node 334 between the second GMR resistor 314 and the fourth GMR resistor 318 is coupled to the second measuring signal terminal 336. The bridge circuit arrangement 300 further includes a switchable current source 340. The current source 340 includes an accompanying current source supply terminal 341 coupled to a supply potential VDDA, as well as a first output terminal 342 coupled to the first supply terminal 322 of the bridge circuit 310, a second output terminal 344 coupled to the first measuring signal terminal 332, and a third output terminal 346 coupled to the second measuring signal terminal 336. The switchable current source 340 further includes a current provision transistor 360, which may, for example, be a P-channel MOS field effect transistor. The current source circuit 340 further includes a first cascode transistor 362, a second cascode transistor 364 and a third cascode transistor 366. The cascode transistors 362, 364, 366 may, for example, be P-channel MOS field effect transistors.

A source terminal of the current provision transistor 360, for example, is coupled to the supply potential VDDA (which is, for example, assumed to be more positive than the reference potential GND in operation). A drain terminal of the current provision transistor 360, for example, is coupled to the source terminals of the first cascode transistor 362, the second cascode transistor 364 and the third cascode transistor 366.

Furthermore, a drain terminal of the first cascode transistor 362 is coupled to the first output terminal 342. A drain terminal of the second cascode transistor 364 is coupled to the second output terminal 344, and a drain terminal of the third cascode transistor 366 is coupled to the third output terminal 346.

With respect to the switchable current source 340, the current provision transistor 360 may, for example, be part of a current mirror arrangement, so that the gate terminal of the current provision transistor 360 is coupled to a gate terminal of a further current mirror transistor (which is not shown here), for example.

Furthermore, the gate terminals of the three cascode transistors 362, 364, 366, for example, are coupled to a suitable control circuit, which is formed to switch on exactly one of the cascode transistors 362, 364, 366, for example. As an alternative thereto, the control circuit may, however, also be capable of activating other (for example, three different) combinations of cascode transistors 362, 364, 366. Furthermore, the gate terminals of the cascode transistors 362, 364, 366 may, for example, be connected to terminals (for example, pins or pads of an integrated circuit), which allow for control of the cascode transistors 362, 364, 366 and/or for switching on and switching off the cascode transistors.

The circuitry 300 further includes a first short-circuit transistor or short-circuit switching transistor 352 and a second short-circuit transistor or short-circuit switching transistor 354. The short-circuit switching transistors 352, 354 may, for example, be low-ohmic NMOS switches or NMOS switching transistors. For example, a drain terminal of the first short-circuit switching transistor 352 is coupled to the first measuring signal terminal 332, whereas a source terminal of the first short-circuit switching transistor 352 is coupled to the reference potential GND in electrically effective manner. A drain terminal of the second short-circuit switching transistor 354 is coupled to the second measuring signal terminal 336, and a source terminal of the second short-circuit switching transistor 354 is coupled to the reference potential GND. Hence, the first short-circuit switching transistor 352 and the second short-circuit switching transistor 354 are coupled to the bridge circuit 310, so as to selectively (depending on control signals at the gate terminals of the corresponding short-circuit switching transistors) bridge and/or short-circuit the third GMR element 316 and/or the fourth GMR element 318.

In the circuitry 300, some lines may be implemented as especially thick and/or with especially low resistance in one embodiment. In one embodiment, the lines drawn as thick in the FIG. 3 are low-ohmic. In one embodiment, the thick-drawn lines, for example, have a resistance of less than ten ohms if it is assumed, for example, that the GMR elements 312, 314, 316, 318 have a resistance of about ten kiloohms (kΩ).

Besides, the circuitry 300 may optionally include an evaluation circuit 380. The evaluation circuit 380 may, for example, include a preamplifier 382. The preamplifier 382, for example, comprises a first input 384 and a second input 386. Furthermore, the evaluation circuit 380, for example, includes a first measuring signal switching transistor 388 (for example, an N-channel MOS field effect transistor), the drain-source path of which is connected between the second measuring signal terminal 336 and the first input 384 of the preamplifier 382. The evaluation circuit 380 further includes a second measuring signal switching transistor 390 (for example, an N-channel MOS field effect transistor), the drain-source path of which is connected between the first measuring signal terminal 332 and the second input 386 of the preamplifier 382. Furthermore, the evaluation circuit, for example, includes a third switching transistor 392 (for example, an N-channel MOS field effect transistor), the drain-source path of which is connected between the first input 384 and the second input 386 of the preamplifier 382.

In the following, the functionality of the circuitry 300 will be summarized briefly. A supply current for the GMR elements or GMR sensor elements 312, 314, 316, 318 (reacting to a present magnetic field by a resistance change based on a gigantic magnetoresistive effect, for example) is provided from a PMOS current source 360 (also designated with P_mir). The PMOS current source 360 may, for example, be a transistor that is part of a current mirror circuit. The current source 360 for example is "cascoded", for example, three cascode transistors 362, 364, 366 are attached to a current output (for example, to the drain terminal) of the transistor 360. The cascode transistors 362, 364, 366 (also designated with P_casc1 to P_casc3) for example, can be switched on selectively (for example, by suitable control of the accompanying gate terminals). In normal operation, for example, only the first cascode transistor 362 (also designated with P_casc2) is switched on. Furthermore, two low-ohmic NMOS switches 352, 354 may short-circuit the third GMR element 316 (GMR3) and/or the fourth GMR element 318 (GMR4) in a test operation (or in a certain phase of the test operation).

Hence, the normal operation may be summarized as follows:

| normal operation | P_case1 | P_case2 | P_case3 | N_switch4 | N_switch5 | operation |
|---|---|---|---|---|---|---|
| 1$^{st}$ phase | off | on | off | off | off | measure Ud |

Within the scope of the above table, the value "off" indicates that a corresponding transistor is switched off, i.e., that a potential placing the transistor in a high-ohmic state is applied at the gate terminal of the corresponding transistor. The designation "on", however, indicates that the corresponding transistor is switched on, i.e., is in a low-ohmic or conducting state of operation. For example, this is achieved by suitable control of the gate terminals.

In the normal operation, the bridge circuit 310 thus is fed via the first supply terminal 322, whereas feeding via the first measuring signal terminal 332 and the second measuring signal terminal 336 is deactivated. Furthermore, the short-circuit switching transistor 352, 354 may also be deactivated.

In the following, an exemplary test mode, which, for example, consists of four phases, will be described. States taken on in the various phases are shown in the following table:

| | P_case1 | P_case2 | P_case3 | N_switch4 | N_switch5 | operation |
|---|---|---|---|---|---|---|
| 1$^{st}$ phase | on | off | off | off | off | measure $U_g: = U_1$ |
| 2$^{nd}$ phase | off | on | off | off | off | measure $U_g: = U_2$ |
| 3$^{rd}$ phase | off | off | on | off | off | measure $U_g: = U_3$ |
| 4$^{th}$ phase | off | on | off | on | on | measure $U_g: = U_4$ |

In other words, in a first phase of the test mode, the bridge circuit 310 is fed via the second measuring signal terminal 336, whereas the feeding via the first supply terminal 322 and the feeding via the first measuring signal terminal 332 are deactivated, for example. Furthermore, the short-circuit switching transistors 352, 354 are deactivated or opened. In the state taken on in the first phase, for example, the voltage $U_g$ is measured at the tap 370 to obtain a first voltage U1.

In a second phase of the test mode, the bridge circuit 310, for example, is fed via the first supply terminal 322, whereas the feeding via the first measuring signal terminal 332 and the feeding via the second measuring signal terminal 336 are deactivated. Furthermore, in the second phase, the short-circuit switching transistors 352, 354 are deactivated, for example. Besides, during the second phase, for example, the voltage $U_g$ is measured at the tap 370 to obtain a voltage $U_2$.

In a third phase, the measuring bridge circuit 310, for example, is fed via the first measuring signal terminal 332, whereas the feeding via the first supply terminal 322 and the feeding via the second measuring signal terminal 336 are deactivated. Furthermore, in the third phase, the short-circuit switching transistors 352, 354 are deactivated or opened.

In a fourth phase of the test mode, the bridge circuit 310, for example, is fed via the first supply terminal 322, whereas the feeding via the first measuring signal terminal 332 and the feeding via the second measuring signal terminal 336 are deactivated. Furthermore, the first switch 352 and the second switch 354 are closed in the fourth phase, for example. Besides, in the fourth phase, the voltage $U_g$ further is measured at the tap 370 to obtain a voltage $U_4$, for example.

With the above-mentioned four voltage values $U_1$, $U_2$, $U_3$, $U_4$ measured, for example, at first the resistances $R_2$, $R_3$, $R_4$ can be put down to $R_1$, and finally $R_1$ may be determined. For example, $R_1$ designates the resistance of the first GMR element 312, $R_2$, for example, designates the resistance of the second GMR element 314, $R_3$, for example, designates the resistance of the third GMR element 316, and $R_4$, for example, designates the resistance of the fourth GMR element 318. Assuming that the current provision transistor 360 (i.e., the current source 360) provides the current IG at its drain terminal, the following applies:

$$U_1 = I_G \times (R_4 \mathbin{/\mkern-5mu/} (R_1 + R_2 + R_3)) \frac{R_1 + R_3}{R_1 + R_2 + R_3};$$

$$U_2 = I_G \times ((R_1 + R_3) \mathbin{/\mkern-5mu/} (R_2 + R_4));$$

$$U_3 = I_G \times (R_3 \mathbin{/\mkern-5mu/} (R_1 + R_2 + R_4)) \frac{R_2 + R_4}{R_1 + R_2 + R_4}.$$

Hence:

$$R_2 = R_1 \frac{U_2 - U_1}{I_G R_1 - U_2 + U_3};$$

$$R_3 = R_1 \frac{U_3}{U_2 - U_3};$$

$$R_4 = R_1 \frac{U_1}{I_G R_1 - U_2 + U_3}.$$

From the fourth phase (or from the voltage $U_4$ measured during the fourth phase), it follows (for example, neglecting the switch resistances of the short-circuit switching transistors 352, 354), with $U_4 = I_G(R_1 \| R_2)$ that:

$$R_2 = R_1 \frac{U_4}{I_G R_1 - U_4}.$$

Equating the two expressions for $R_2$ results in:

$$I_G R_1 = U_4 \frac{U_1 - U_3}{U_1 - U_2 + U_4}.$$

Hence:

$$R_2 = R_1 \frac{U_1 - U_2 + U_4}{U_2 - U_3 - U_4}.$$

Thus, the four resistances $R_1$, $R_2$, $R_3$, $R_4$ (or element values of the four GMR elements 312, 314, 316, 318), for example, are obtained as a result, depending on the voltages measured (and on the current $I_G$):

$$R_1 = \frac{1}{I_G} U_4 \frac{U_1 - U_3}{U_1 - U_2 + U_4};$$

$$R_2 = R_1 \frac{U_1 - U_2 + U_4}{U_2 - U_3 - U_4};$$

$$R_3 = R_1 \frac{U_3}{U_2 - U_3};$$

$$R_4 = R_1 \frac{U_1 - U_2 + U_4}{U_2 - U_3 - U_4} \times \frac{U_1}{U_2 - U_1}.$$

It is to be pointed out that the calculation rules shown above are only to be regarded as exemplary. Alternatively, other calculation rules also could be employed, so as to calculate element values of the various resistive elements of the bridge circuit 310 (i.e., for example, resistance values of the GMR elements) due to various measurement values for the voltage $U_g$ in the various phases of the test mode. Besides, it is to be pointed out that another voltage may also be measured. In other words, it is not necessary to measure the voltage $U_g$, but another voltage at another node of the bridge circuit 310 could also be measured.

In the following, an example will still be given for illustration. Assuming the resistances $R_1$, $R_2$, $R_3$ and $R_4$ at 10000 ohms, 100 μl ohms, 9985 ohms and 10027 ohms, as well as the current $I_G$ at 200 microamperes, voltages $U_1$, $U_2$, $U_3$, $U_4$ of 1.00137 volts, 2.00115 volts, 0.999822 volts and 1.00055 volts result. Inserting the voltages mentioned into the above formulae, for example, one again obtains the assumed resistances.

In the following, some further aspects of the invention will still be explained briefly.

Figure 4:
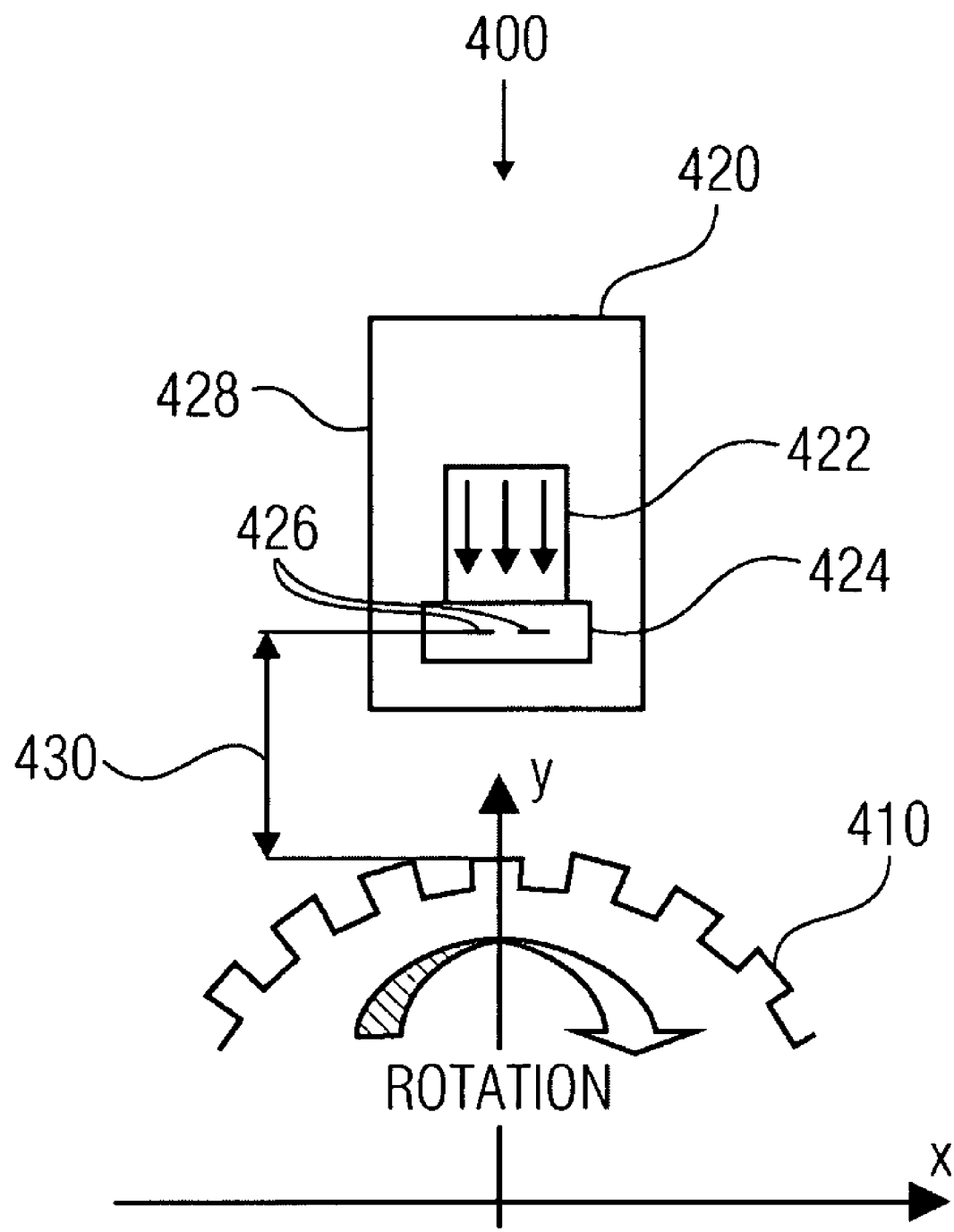
FIG. 4 shows a schematic illustration of a possible case of application of a measuring bridge arrangement according to an embodiment of the invention.

Thus, what will be described on the basis of FIG. 4 is a field of application in which the above-described measuring bridge arrangement can be employed. FIG. 4 shows a schematic illustration of an arrangement for detection of a rotation. The arrangement according to FIG. 4 is designated with 400 in its entirety. For example, the arrangement 400 includes a toothed wheel 410, which may also be regarded as a permeable target wheel. The arrangement 400 further includes a sensor arrangement 420. The sensor arrangement 420 includes a permanent magnet 422 as well as a magnetic field sensor 424. The magnetic field sensor 424 includes magnetosensitive elements 426, which are also referred to as XMR or XMR elements and, for example, are arranged between the permanent magnet 422 and the toothed wheel 410. Besides, the permanent magnet 422 and the magnetic field sensor 424 are arranged within a protective cover 428, for example. Furthermore, there is a magnetic gap or a magnetic air gap 430 between the magnetoresistive elements and teeth of the toothed wheel 410, for example.

In ABS sensors, in crankshaft sensors and in camshaft sensors, movement of the wheels is detected by means of magnetic sensors, for example. Here, among other things, toothed wheels (e.g., a toothed wheel 410) are used in connection with a small permanent magnet (for example, the permanent magnet 422) on a rear side of the sensors.

Through movement of the wheel, a sine-shaped magnetic field (or a magnetic field with sine-shaped time dependence) develops at the sensor (e.g., at the magnetic field sensor 424). In XMR sensors, for example, a component of the magnetic field in a chip plane and at the same time in a direction of a rotation of the wheel is evaluated. In some applications, a small permanent magnet is arranged in a magnetic field sensor, and both are placed in front of a permeable toothed disc. If the disk is rotated, the teeth pass in front of the sensor and generate a small field variation, which is detected by the sensor and which includes information on angle position and rotation speed of the disk. A waveform of the field is approximately sine-shaped, and an amplitude decreases drastically with the air gap.

For testing speed GMR user-specific integrated circuits on disc level (FE test) as well as on package level (BE test) at a semiconductor manufacturer, for example, function of the integrated circuits is ensured. In some cases, however, it is not possible to integrate the mechanical construction shown on the basis of FIG. 4 into a test environment. For example, test times would increase significantly, because significant time is needed for defined movement of the mechanical masses.

According to some embodiments of the invention, the bridge circuit of the GMR elements is cancelled in a test mode (at least with respect to electrical behavior), so that the individual GMR elements can be tested independently of each other in a homogeneous magnetic field. Such a magnetic field may, for example, be generated simply by means of pole shoes or air coils. Hence, errors induced by small positional tolerances may be avoided due to homogeneity of the magnetic fields, for example.

According to some embodiments, it thus is possible to characterize GMR elements in a package in a homogeneous background field. In this case, no magnetic core is needed, but an air coil is sufficient for generating the homogeneous magnetic field. Here (for example, when testing a GMR bridge), great positional tolerances may be achieved (i.e., for example, make a test arrangement insensitive to positional tolerances, for example) and further additionally achieve hysteresis freedom.

Some embodiments of the invention therefore relate to a system with test modes for determining several or all of the GMR resistances in a homogeneous magnetic field.

Figure 5:
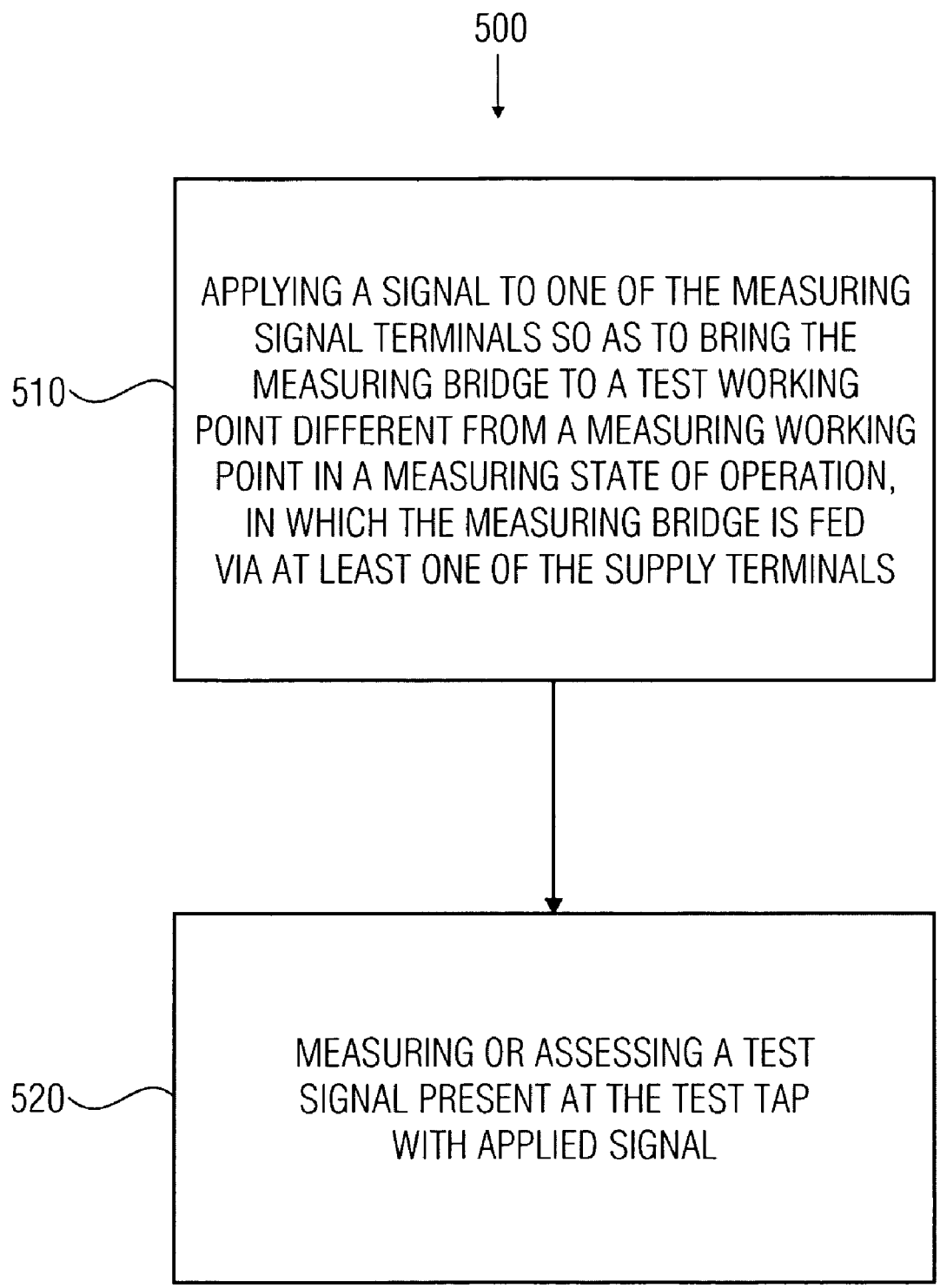
FIG. 5 shows a flowchart of the method of testing a measuring bridge according to an embodiment of the invention.

Thus, FIG. 5 shows a flowchart of a method of testing a measuring bridge arrangement. The method according to FIG. 5 is designated with 500 in its entirety. The method 500 includes, in a first step 510, applying a signal to one of the measuring signal terminals so as to bring the measuring bridge to a test working point different from a measuring working point in a measuring state of operation in which the measuring bridge is fed via at least one of the supply terminals. The method 500 further includes, in a second step 520, measuring or assessing a test signal present at the test tap. For example, the test signal is measured or assessed while the above-mentioned signal is applied at the at least one measuring signal terminal.

The method 500 according to FIG. 5 may be supplemented by all those features and steps also having been described with respect to the present devices.

Figure 6A:
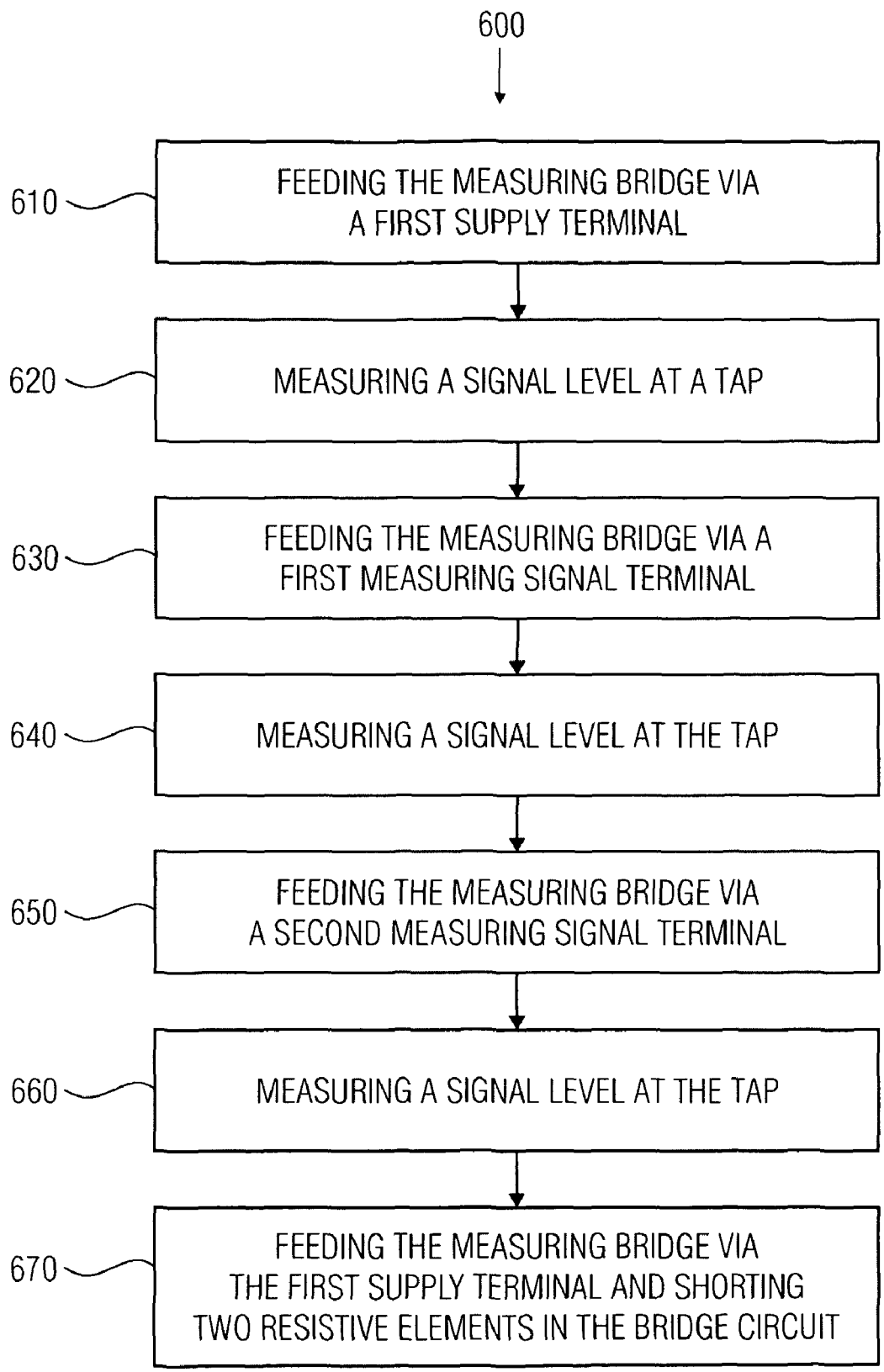
FIG. 6*a* shows a first part of a flowchart of a method of testing a measuring bridge according to a further embodiment of the invention.
Figure 6B:
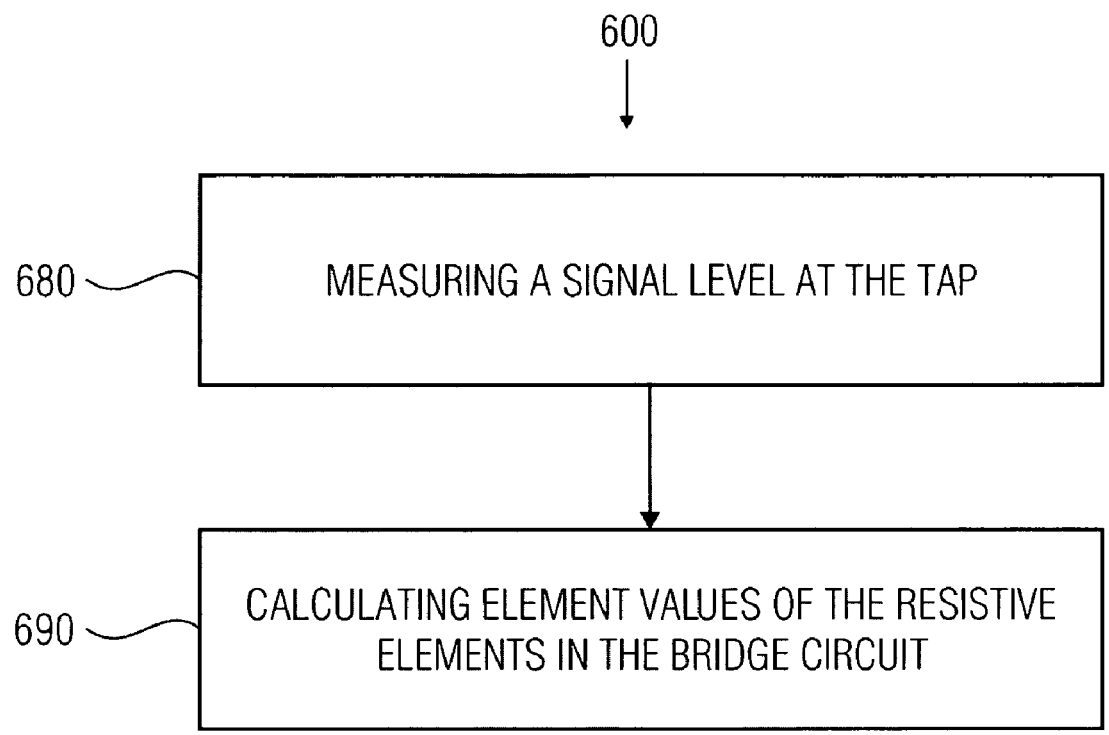
FIG. 6*b* shows a second part of a flowchart of a method according to FIG. 6*a*.

FIGS. 6a and 6b show a flowchart of a method of testing a measuring bridge, according to an embodiment of the invention. The method according to FIGS. 6a and 6b is designated with 600 in its entirety. The method 600 includes, in a first step 610, feeding the measuring bridge via a first supply terminal, and, in a second step 620, measuring a signal level at a tap (assuming that the measuring bridge is fed via the first supply terminal when measuring in the step 620). Thus, a first measurement value is obtained, for example.

The method 600 further includes, in a third step 630, feeding the measuring bridge via a first measuring signal terminal, as well as, in a fourth step 640, measuring a signal level at the tap. Thus, a second measurement value is obtained, for example.

The method 600 includes, in a fifth step 650, feeding the measuring bridge via a second measuring signal terminal. In a sixth step 660, a signal level is measured at the tap while the measuring bridge is fed via the second measuring signal terminal, for example.

The method 600 includes a seventh step 670, in which the measuring bridge is fed via the first supply terminal and in which two resistive elements of the bridge circuit further are shorted. The method 600 includes, in an eighth step 680, measuring a signal level at the tap, for example in the state in which the measuring bridge is fed via the first supply terminal and in which two resistive elements of the bridge circuit are shorted.

The method 600 further includes, in a ninth step 690, calculating element values of the resistive elements of the bridge circuit, for example, based on the measured signal levels at the tap.

It is to be noted that the order of the steps 610 to 680 is not fixedly predetermined. Rather, the various states or working points of the measuring bridge may be adjusted in another order. Moreover, it is not necessary to perform all of the steps 610 to 680. Rather, it is sufficient to use only one step of feeding and one step of measuring. Alternatively, however, two, three, four or more steps of feeding and measuring may also be performed. Moreover, it is to be pointed out that the method 600 according to FIGS. 6a and 6b may be supplemented by all those steps or features having been explained within the scope of the present description.

The methods 500, 600 may be part of a method of testing a direction sensor with GMR elements, for example, with at least one measuring bridge including magnetoresistive elements, or at least two measuring bridges including magnetoresistive elements. The measuring bridges may here, for example, correspond to the measuring bridges described on the basis of FIGS. 1, 2a and 3 and be embedded in corresponding measuring bridge arrangements.

For example, in a first direction sensor test step, a first magnetic field (for example, an approximately homogeneous magnetic field) with a first magnetic field direction may be applied to the direction sensor. Then, for example using the method 600, measurement values (for example, four measurement values) may be obtained, which describe the signal at the tap with applied first magnetic field. From the four measurement values, for example, the element values of elements (for example, of four magnetoresistive elements) of a first bridge circuit with an applied first magnetic field may be calculated. Optionally, for example, element values of elements (for example, of four magnetoresistive elements) of a second bridge circuit with applied first magnetic field may be calculated additionally. Furthermore, it may be decided whether the element values satisfy a predetermined specification, i.e., for example, are within predetermined tolerance ranges.

In an (optional) second direction sensor testing step, for example, a second magnetic field (for example, an approximately homogeneous magnetic field) with a second magnetic field direction may be applied to the direction sensor.

Then, for example, using the method 600, further measurement values (for example, four further measurement values) may be obtained, which describe the signal at the tap with applied second magnetic field. From the four measurement values, for example, the element values of elements (for example, of four magnetoresistive elements) of a first bridge circuit with applied second magnetic field may be calculated. Optionally, for example, element values of elements (for example, of four magnetoresistive elements) of a second bridge circuit with applied second magnetic field may be calculated additionally. Furthermore, it may be decided whether the element values with applied second magnetic field satisfy a predetermined specification, i.e., are within predetermined tolerance ranges.

Thus, for example, a direction sensor, or generally a sensor including a magnetosensitive or magnetoresistive element in a bridge circuit, may be tested using substantially homogeneous magnetic fields.

The test method described above is, however, also applicable to the test of bridge circuits with arbitrary resistive elements in general and allows for a simple test in which element values of individual elements of the bridge circuit may be determined effectively without undoing the bridge circuit.

Figure 7:
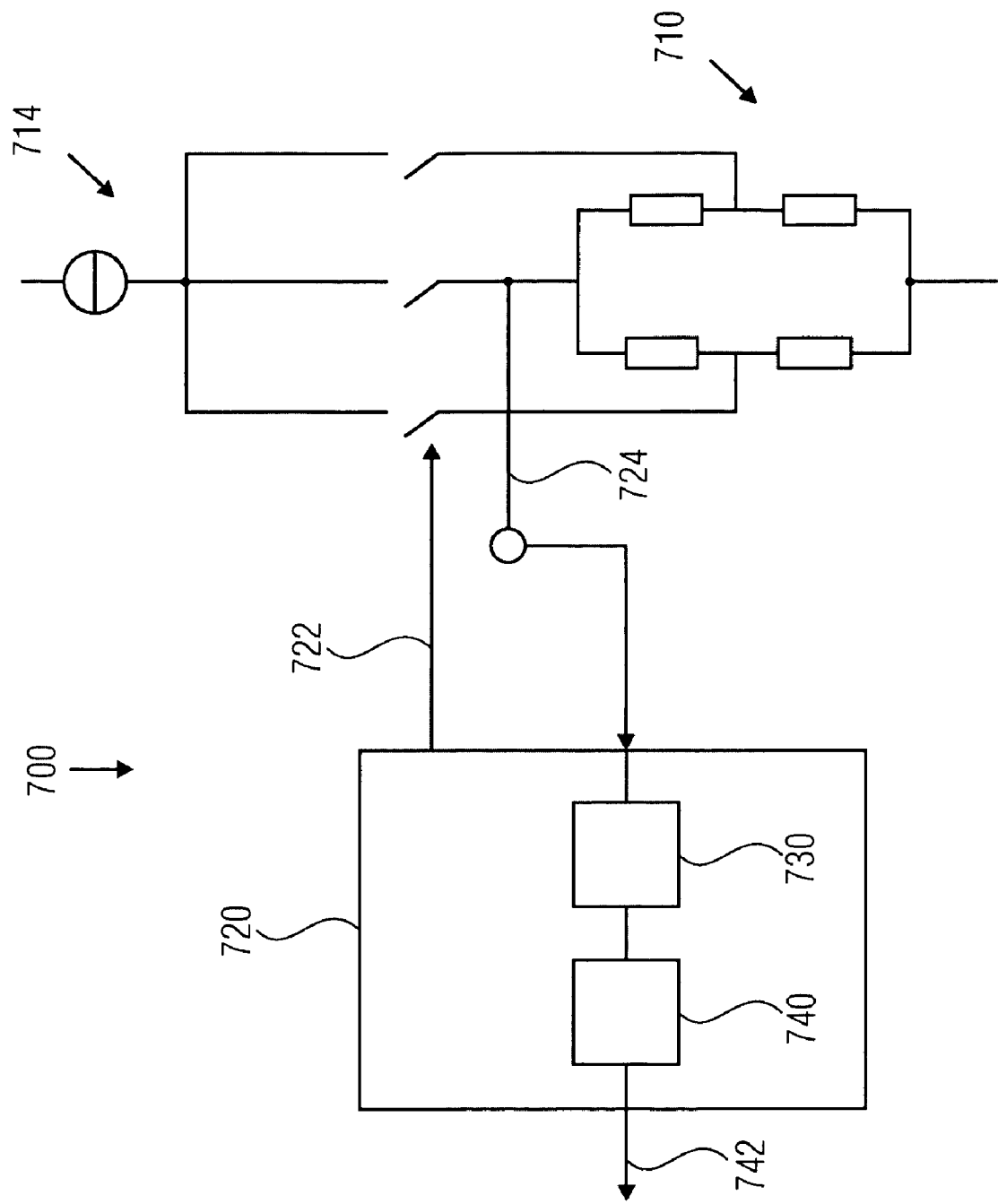
FIG. 7 shows a block circuit diagram of a test circuit arrangement for testing a measuring bridge according to an embodiment of the invention.

FIG. 7 shows a block circuit diagram of a test arrangement for testing a measuring bridge with at least a first supply terminal and a first and second measuring signal terminal, according to an embodiment of the invention. The test arrangement according to FIG. 7 is designated with 700 in its entirety. The measuring arrangement 700 includes a measuring bridge 710, which may, for example, correspond to the measuring bridges described above. The measuring arrangement further includes a working point adjustment circuit 714 coupled to the measuring bridge 710, as this was explained on the basis of FIGS. 1, 2a, 2b, and 3, for example.

The test arrangement 700 further includes a control circuit 720 coupled to the working point adjustment circuit 714 to supply a control signal to the working point adjustment circuit 714. The control circuit 720 further is coupled to the tap of the measuring bridge to obtain information on a signal at the tap 724 at the measuring bridge 710. For example, the control may comprise the measurement value provider 730 coupled to the tap 724 of the measuring bridge 710 to obtain information on the signal present at the tap 724. The measurement value provider may, for example, be directly coupled to the tap 724 in an electrically conducting manner to receive an analog signal present at the tap 724. The measurement value provider may, however, alternatively also be configured to receive digital information (for example, from an analog-digital converter) describing the signal at the tap 724.

With respect to the function of the test arrangement 700, it is to be noted that the control is formed to generate a control signal instructing the working point adjustment circuit 714 to apply a signal to a first measuring signal terminal of the measurement quantity 710 so as to bring the measuring bridge 710 to a test working point different form a measuring working point in the measuring state of operation.

The measurement value provider 730, for example, is formed to obtain a measurement value carrying information on a value of the test signal with a signal applied at the measuring signal terminal.

For example, the controller further includes an element value calculator 740 coupled to the measurement value provider 730, to obtain one or more measurement values from the measurement value provider 730. The element value calculator 740, for example, is formed to determine an element value of a resistive element in the measuring bridge. Thus, the measurement value determiner 740, for example, provides element value information 742 describing an element value of at least one element of the measuring bridge 710.

Thus, the test arrangement allows for testing the measuring bridge 710 in a homogeneous magnetic field in the embodiments.

Figure 8:
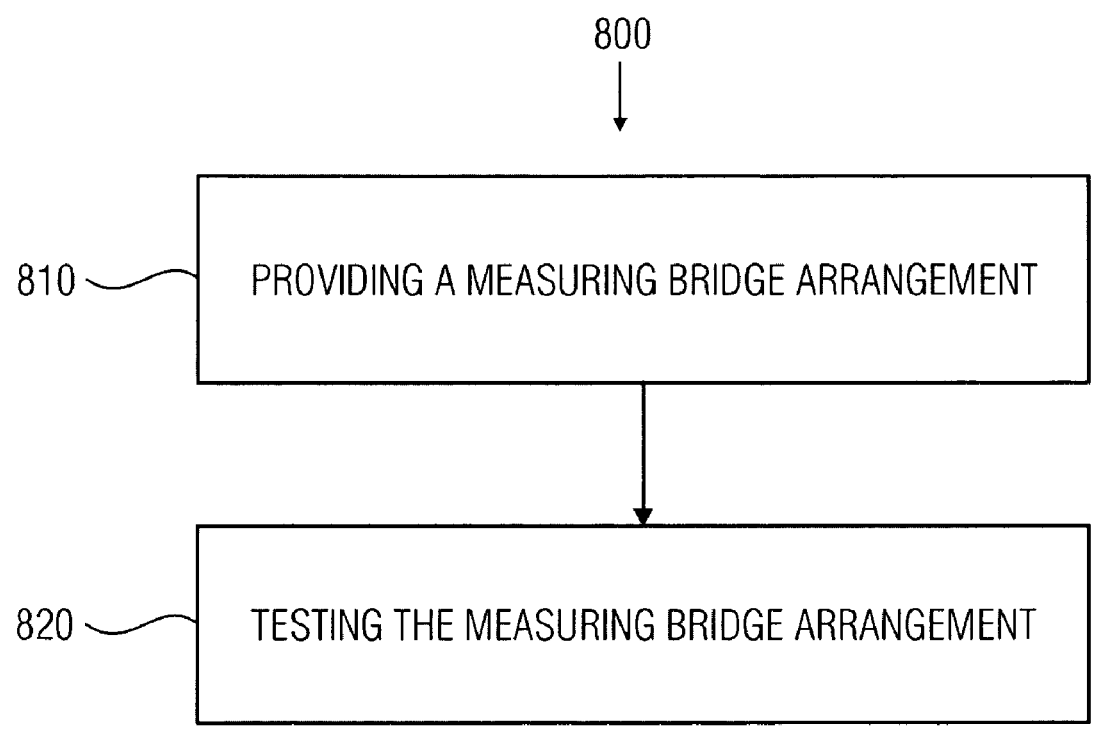
FIG. 8 shows a flowchart of a method of producing a tested measuring bridge according to an embodiment of the invention.

FIG. 8 shows a flowchart of a method of producing a tested measuring bridge arrangement, according to an embodiment of the invention. The method according to FIG. 8 is designated with 800 in its entirety. The method 800 includes, in a first step 810, providing a measuring bridge arrangement, as it was, for example, described above. The measuring bridge arrangement may here be produced with any production methods known.

The method 800 further includes, in a second step 820, testing the measuring bridge arrangement according to one of the testing methods described above.

It is to be pointed out that the devices or methods described above may be changed substantially. For example, the circuitries described above may be changed substantially. The resistive elements may, for example, be formed by GMR elements or any other resistive elements. Here, a mixture of fixed resistances and resistances dependent on a measurement quantity may be used, for example. Alternatively, also four resistances dependent on a measurement quantity may be used.

Furthermore, it is not necessary to realize the above-described circuitries with MOS field effect transistors. Rather, other field effect transistors, for example, junction field effect transistors, may be used. Furthermore, individual ones or all of the transistors shown may also be realized by bipolar transistors. Thus, for example, a P-channel field effect transistor may be replaced by a PNP bipolar transistor. An N-channel field effect transistor may, for example, be replaced by an NPN bipolar transistor. In such a replacement, for example, an emitter terminal of the bipolar transistor corresponds to a source terminal of the field effect transistor. Source terminals and emitter terminals are generally referred to as source terminals. A collector terminal of a bipolar transistor, for example corresponds to a drain terminal of a field effect transistor. Collector terminals and drain terminals are generally referred to as collecting terminals or drain terminals. A base terminal of a bipolar transistor, for example, corresponds to a gate terminal of a field effect transistor. Base terminals and gate terminals are generally referred to as control terminals.

Besides, the inventive methods may also be realized in software, for example, using a programmable computer.

In some embodiments of the invention, one or more of the effects mentioned in the following develop:

1. A GMR loop is not interrupted by switches. In some embodiments, a test connection in a normal operation thus does not have any influence or only a negligible influence.

2. The GMR elements are not grounded via switches, but directly via a wiring (i.e., for example, coupled to a reference potential GND). Thereby, the test mode does not affect performance in operation, for example. In some embodiments, even at a minimum supply voltage, no impairment or only negligible impairment arises. Only at high temperatures are the short-circuit switching transistors 352, 354 able to slightly influence the bridge through leakage currents. But here also only differences or mismatches of the leakage currents have any influence, however.

3. The GMR elements or GMR resistors may, for example, be sensed individually by measuring the potential $U_g$ in the test mode, wherein only a homogeneous magnetic field has to be generated. In some embodiments, no core is necessary for testing the GMR elements or GMR resistors for this reason. Thereby, an influence of a core hysteresis may, for example, be avoided. Furthermore, in some embodiments, no eddy currents develop, and there is no limitation of a maximum field. Furthermore, in some embodiments, non-linearity and temperature limitation can be avoided.

4. The test mode can be realized with relatively small effort. In one embodiment, two additional cascode transistors 362, 366 (P_casc1, P_casc3) as well as two low-ohmic switches 532, 534 (N_switch4, N_switch5) are necessary. Furthermore, in one embodiment, control logic for activating the test mode is present. Moreover, in some embodiments, the potential $U_g$ can be measured, which can, for example, be realized by use of a test pad, a test pin or an analog-digital converter attached to receive the voltage $U_g$.

Some embodiments enable the bridge circuit of the GMR elements to be broken in a test mode, so that each element or GMR element can be characterized individually in a homogeneous magnetic field.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

What is claimed is:

1. A measuring bridge arrangement, comprising:
   a measuring bridge with four resistive elements, at least a first supply terminal, a first measuring signal terminal, a second measuring signal terminal and a test tap, wherein measurement signals dependent on properties of at least one resistive element of the measuring bridge can be tapped at the test tap of the measuring bridge in each of four different states of operation; and
   a working point adjustment circuit to bring the measuring bridge into the four states of operation and defining different working points of the measuring bridge,
   wherein, in a first state of operation, the working point adjustment circuit feeds the measuring bridge via at least the first supply terminal,
   wherein, in a second state of operation, the working point adjustment circuit feeds the measuring bridge via the first measuring signal terminal,
   wherein, in a third state of operation, the working point adjustment circuit feeds the measuring bridge via the second measuring signal terminal, and
   wherein in a fourth state of operation, the working point adjustment circuit feeds the measuring bridge via at least the first supply terminal and wherein a shunt element providing for a current path in parallel to one of the four resistive elements of the measuring bridge is activated.

2. The measuring bridge arrangement according to claim 1, wherein the working point adjustment circuit comprises a current source circuit formed to supply a current signal to the first measuring signal terminal in the second state of operation.

3. The measuring bridge arrangement according to claim 1, wherein the working point adjustment circuit comprises a switch formed to interrupt feeding of the measuring bridge via the first supply terminal in the second and third states of operation.

4. The measuring bridge arrangement according to claim 1, wherein the working point adjustment circuit comprises a plurality of switches formed to apply a signal alternatively to the first measuring signal terminal or to the second measuring signal terminal in the second and third states of operation.

5. The measuring bridge arrangement according to claim 4, wherein the working point adjustment circuit comprises a switchable current source formed to supply a current signal alternatively to the first measuring signal terminal or to the second measuring signal terminal in the second and third states of operation.

6. The measuring bridge arrangement according to claim 1, wherein the working point adjustment circuit comprises a switched current source formed to apply a current signal selectively to the first supply terminal, to the first measuring signal terminal or to the second measuring signal terminal.

7. The measuring bridge arrangement according to claim 6, wherein the switched current source comprises a first current source transistor, a second current source transistor and a third current source transistor, wherein a collecting terminal of the first current source transistor is electrically coupled to the first supply terminal, wherein a collecting terminal of the second current source transistor is electrically coupled to the first measuring signal terminal and wherein a collecting terminal of the third current source transistor is electrically coupled to the second measuring signal terminal.

8. The measuring bridge arrangement according to claim 7, wherein source terminals of the first, second and third current source transistors are electrically connected to a collecting terminal of a fourth current source transistor,
   wherein the fourth current source transistor is formed to provide a working point current, and
   wherein the first, second and third current source transistors are formed to supply the working point current selectively to the first supply terminal, to the first measuring signal terminal or to the second measuring signal terminal.

9. The measuring bridge arrangement according to claim 8, wherein the first, second and third current source transistors are configured to act as switchable cascode transistors.

10. The measuring bridge arrangement according to claim 1, wherein the shunt element comprises at least one short-circuit switch coupled to the measuring bridge to selectively bridge a resistive element of the measuring bridge so as to bring the measuring bridge to the fourth state of operation.

11. The measuring bridge arrangement according to claim 1, wherein the shunt element comprises a first short-circuit switch and a second short-circuit switch, wherein the first short-circuit switch is coupled to the measuring bridge so as to selectively bridge a first resistive element of the measuring bridge, and wherein the second short-circuit switch is coupled to the measuring bridge so as to selectively bridge a second resistive element of the measuring bridge.

12. The measuring bridge arrangement according to claim 11, wherein the first short-circuit switch comprises a first short-circuit switch transistor,
   wherein the second short-circuit switch comprises a second short-circuit switch transistor, wherein a source terminal of the first short-circuit switch transistor is electrically coupled to a first terminal of a first resistive element, wherein a collecting terminal of the second short-circuit switch transistor is electrically coupled to a second terminal of the first resistive element, wherein a source terminal of the second short-circuit switch transistor is electrically coupled to a first terminal of the second resistive element, and wherein a collecting terminal of the first short-circuit switch transistor is electrically coupled to a second terminal of the second resistive element.

13. The measuring bridge arrangement according to claim 1, wherein the measuring bridge comprises a second supply terminal directly coupled to a reference potential, or wherein at least two resistive elements of the measuring bridge are electrically coupled directly to a reference potential supply for a reference potential.

14. The measuring bridge arrangement according to claim 1, wherein the measuring bridge arrangement comprises an analog-to-digital converter, an input of which is electrically coupled to the test tap and which is formed to digitize the test signal.

15. The measuring bridge arrangement according to claim 1, wherein the measuring bridge arrangement comprises control logic formed to activate the states of operation.

16. A method of testing a measuring bridge with four resistive elements, at least a first supply terminal, a first measuring signal terminal, a second measuring signal terminal and a test tap, the method comprising:

bringing the measuring bridge into first, second, third and fourth states of operation that define different working points of the measuring bridge and detecting at the test tap a measurement value associated with each of the first to fourth states of operation;

characterizing the four resistive elements of the measuring bridge based on the detected measurement values;

wherein, in the first state of operation, the measuring bridge is fed via the at least first supply terminal;

wherein, in the second state of operation, the measuring bridge is fed via the first measuring signal terminal;

wherein, in the third state of operation, the measuring bridge is fed via the second measuring signal terminal; and wherein, in the fourth state of operation, the measurement bridge is fed via at least the first supply terminal and wherein a shunt element providing for a current path in parallel to one of the four resistive elements of the measuring bridge is activated.

17. The method according to claim 16, wherein the method further comprises calculating element values of elements of the four resistive elements of the measuring bridge based on the detected measurement values.

18. The method according to claim 17, further comprising deciding whether the resistive elements of the measuring bridge satisfy a predetermined specification, based on the calculated element values.

19. The method according to claim 16, wherein feeding of the measuring bridge via the first supply terminal is deactivated while the measuring bridge is fed via the first measuring signal terminal, and wherein feeding of the measuring bridge via the first supply terminal is deactivated while the measuring bridge is fed via the second measuring signal terminal.

20. The method according to claim 16, wherein activating the shunt element comprises substantially short-circuiting the resistive element.

21. The method according to claim 16, wherein, in the fourth state of operation, a first shunt element providing a first parallel current path to a first resistive element of the measuring bridge and a second shunt element providing a second parallel current path to a second resistive element of the measuring bridge are activated at the same time.

22. The method of testing a measuring bridge that comprises four resistive elements at least one of which is a magnetoresistive sensor element, at least a first supply terminal, a first measuring signal terminal, a second measuring signal terminal and a test tap, the method comprising:

generating a first magnetic field homogeneous in a spatial area of the measuring bridge;

testing the measuring bridge with the first magnetic field applied by:

bringing the measuring bridge into first, second, third and fourth states of operation that define different working points of the measuring bridge and detecting a measurement value associated with each of the first to fourth states of operation; and characterizing the four resistive elements of the measuring bridge based on the detected measurement values, wherein, in the first state of operation, the measuring bridge is fed via the at least first supply terminal, wherein, in the second state of operation, the measuring bridge is fed via the first measuring signal terminal, wherein, in the third state of operation, the measuring bridge is fed via the second measuring signal terminal, and wherein, in the fourth state of operation, the measurement bridge is fed via at least the first supply terminal and wherein a shunt element providing for a current path in parallel to one of the four resistive elements of the measuring bridge is activated.

23. The method according to claim 22, further comprising:

generating a second magnetic field homogeneous in the spatial area of the measuring bridge and an orientation of which differing from an orientation of the first magnetic field;

testing the measuring bridge with applied second magnetic field by:

bringing the measuring bridge into first, second, third and fourth states of operation that define different working points of the measuring bridge and detecting a measurement value associated with each of the first to fourth states of operation; and characterizing the four resistive elements of the measuring bridge based on the detected measurement values, wherein, in the first state of operation, the measuring bridge is fed via the at least first supply terminal, wherein, in the second state of operation, the measuring bridge is fed via the first measuring signal terminal, wherein, in the third state of operation, the measuring bridge is fed via the second measuring signal terminal, and wherein, in the fourth state of operation, the measurement bridge is fed via at least the first supply terminal and wherein a shunt element providing for a current path in parallel to one of the four resistive elements of the measuring bridge is activated.

24. A computer program for performing, when the computer program is executed on a computer, a method of testing a measuring bridge, the method comprising:

bringing the measuring bridge into first, second, third and fourth states of operation that define different working points of the measuring bridge and detecting a measurement value associated with each of the first to fourth states of operation; and characterizing four resistive elements of the measuring bridge based on the detected measurement values, wherein, in the first state of operation, the measuring bridge is fed via a first supply terminal of the measuring bridge, wherein, in the second state of operation, the measuring bridge is fed via a first measuring signal terminal of the measuring bridge, wherein, in the third state of operation, the measuring bridge is fed via a second measuring signal terminal of the measuring bridge, and wherein, in the fourth state of operation, the measurement bridge is fed via at least the first supply terminal and wherein a shunt element providing for a current path in parallel to one of the four resistive elements of the measuring bridge is activated.

25. A computer program for performing, when the computer program is executed on a computer, a method of testing a measuring bridge, the method comprising:

generating a first magnetic field homogeneous in a spatial area of the measuring bridge;

testing the measuring bridge with the first magnetic field applied by:

bringing the measuring bridge into first, second, third and fourth states of operation that define different working points of the measuring bridge and detecting a measurement value associated with each of the first to fourth states of operation; and characterizing four resistive elements of the measuring bridge based on the detected measurement values, wherein, in the first state of operation, the measuring bridge is fed via at least a first supply terminal, wherein, in the second state of operation, the measuring bridge is fed via a first measuring signal terminal, wherein, in the third state of operation, the measuring bridge is fed via a second measuring signal terminal, and wherein, in the fourth state of operation, the measurement bridge is fed via at least the first supply terminal and wherein a shunt element providing for a current path in parallel to one of the four resistive elements of the measuring bridge is activated.

26. A test arrangement for testing a measuring bridge in a measuring bridge arrangement comprising:

a measuring bridge with four resistive elements, at least a first supply terminal, a first measuring signal terminal, a second measuring signal terminal and a test tap, wherein measurement signals dependent on properties of at least one resistive element of the measuring bridge can be tapped at the test tap of the measuring bridge in each of four different states of operation; and a working point adjustment circuit to bring the measuring bridge into the four states of operation and defining different working points of the measuring bridge, wherein, in a first state of operation, the working point adjustment circuit feeds the measuring bridge via at least the first supply terminal, wherein, in a second state of operation, the working point adjustment circuit feeds the measuring bridge via the first measuring signal terminal, wherein, in a third state of operation, the working point adjustment circuit feeds the measuring bridge via the second measuring signal terminal, and wherein in a fourth state of operation, the working point adjustment circuit feeds the measuring bridge via at least the first supply terminal and wherein a shunt element providing for a current path in parallel to one of the four resistive elements of the measuring bridge is activated, the test arrangement comprising:

a controller formed to generate control signals instructing the measuring bridge arrangement to bring the measuring bridge to the four states of operation;

a measurement value provider formed to acquire measurement values associated with the four states of operation; and an element value calculator formed to determine element values of the individual resistive elements in the measuring bridge, based on the measurement values.

27. A measuring bridge arrangement, comprising:

a measuring bridge comprising a first resistive element, a second resistive element, a third resistive element, and a fourth resistive element, and comprising a first supply terminal, a first measuring signal terminal, and a second measuring signal terminal, wherein the first resistive element and the third resistive element are connected in series between the first supply terminal and a second supply terminal or between the first supply terminal and a reference potential supply, wherein the second resistive element and the fourth resistive element are connected in series between the first supply terminal and the second supply terminal or between the first supply terminal and the reference potential supply, wherein a node electrically located between the first resistive element and the third resistive element is coupled to the first measuring signal terminal, and wherein a node electrically located between the second resistive element and the fourth resistive element is coupled to the second measuring signal terminal;

a switchable current source with three current terminals, wherein a first current terminal is coupled to the first supply terminal to feed a bridge circuit via the first supply terminal, wherein a second current terminal is coupled to the first measuring signal terminal to feed the bridge circuit via the first measuring signal terminal, and wherein a third current terminal is coupled to the second measuring signal terminal to feed the bridge circuit via the second measuring signal terminal;

a first short-circuit switch formed to short-circuit the third resistive element; and a second short-circuit switch formed to short-circuit the fourth resistive element.

28. A measuring bridge arrangement, comprising:

a measuring bridge with at least a first supply terminal, first and second measuring signal terminals and a test tap, wherein a test signal dependent on properties of at least one resistive element of the measuring bridge can be tapped at the test tap of the measuring bridge; and a working point adjustment circuit to feed the measuring bridge via at least the first supply terminal in a measuring state of operation, and to apply a signal to one of the measuring signal terminals in a test state of operation so as to bring the measuring bridge to a test working point different from a measuring working point in the measuring state of operation;

wherein the measuring bridge arrangement comprises a first short-circuit switch and a second short-circuit switch, wherein the first short-circuit switch is coupled to the measuring bridge so as to selectively bridge a first resistive element of the measuring bridge, and wherein the second short-circuit switch is coupled to the measuring bridge so as to selectively bridge a second resistive element of the measuring bridge, wherein the first short-circuit switch is coupled between the first measuring signal terminal and ground and wherein the second short-circuit switch is coupled between the second measuring signal terminal and ground.

29. The measuring bridge arrangement according to claim 28, wherein the working point adjustment circuit comprises a current source circuit formed to supply a current signal to at least one of the measuring signal terminals in the test state of operation.

30. The measuring bridge arrangement according to claim 28, wherein the working point adjustment circuit comprises a switch formed to interrupt feeding of the measuring bridge via the first supply terminal in the test state of operation.

31. The measuring bridge arrangement according to claim 28, wherein the working point adjustment circuit comprises a plurality of switches formed to apply a signal alternatively to the first measuring signal terminal or to the second measuring signal terminal in the test state of operation, in order to bring the measuring bridge to at least two different test working points different from the measuring working point.

32. The measuring bridge arrangement according to claim 31, wherein the working point adjustment circuit comprises a switchable current source formed to supply a current signal alternatively to the first measuring signal terminal or to the second measuring signal terminal in the test state of operation.

33. The measuring bridge arrangement according to claim 28, wherein the working point adjustment circuit comprises a switched current source formed to apply a current signal selectively to the first supply terminal, to the first measuring signal terminal or to the second measuring signal terminal.

34. The measuring bridge arrangement according to claim 33, wherein the switched current source comprises a first current source transistor, a second current source transistor and a third current source transistor, wherein a collecting terminal of the first current source transistor is electrically coupled to the first supply terminal, wherein a collecting terminal of the second current source transistor is electrically coupled to the first measuring signal terminal and wherein a collecting terminal of the third current source transistor is electrically coupled to the second measuring signal terminal.

35. The measuring bridge arrangement according to claim 34, wherein source terminals of the first, second and third current source transistors are electrically connected to a collecting terminal of a fourth current source transistor,
    wherein the fourth current source transistor is formed to provide a working point current, and
    wherein the first, second and third current source transistors are formed to supply the working point current selectively to the first supply terminal, to the first measuring signal terminal or to the second measuring signal terminal.

36. The measuring bridge arrangement according to claim 35, wherein the first, second and third current source transistors are configured to act as switchable cascode transistors.

37. The measuring bridge arrangement according to claim 28, wherein the measuring bridge arrangement comprises at least one short-circuit switch coupled to the measuring bridge to selectively bridge a resistive element of the measuring bridge so as to bring the measuring bridge to a short-circuit working point.

38. The measuring bridge arrangement according to claim 28, wherein the first short-circuit switch comprises a first short-circuit switch transistor,
    wherein the second short-circuit switch comprises a second short-circuit switch transistor,
    wherein a source terminal of the first short-circuit switch transistor is electrically coupled to a first terminal of a first resistive element,
    wherein a collecting terminal of the second short-circuit switch transistor is electrically coupled to a second terminal of the first resistive element,
    wherein a source terminal of the second short-circuit switch transistor is electrically coupled to a first terminal of the second resistive element, and
    wherein a collecting terminal of the first short-circuit switch transistor is electrically coupled to a second terminal of the second resistive element.

39. The measuring bridge arrangement according to claim 28, wherein the measuring bridge comprises a second supply terminal directly coupled to a reference potential, or wherein at least two resistive elements of the measuring bridge are electrically coupled directly to a reference potential supply for a reference potential.

* * * * *